United States Patent [19]

Evans, Jr. et al.

[11] Patent Number: 5,677,825
[45] Date of Patent: Oct. 14, 1997

[54] FERROELECTRIC CAPACITOR WITH REDUCED IMPRINT

[76] Inventors: Joseph T. Evans, Jr., 13609 Verbena Pl., NE., Albuquerque, N. Mex. 87112; William L. Warren, 7716 Wm. Moyers Ave., NE.; Bruce A. Tuttle, 12808 Lillian Pl., NE., both of Albuquerque, N. Mex. 87122; Duane B. Dimos, 6105 Innsbrook Ct., NE., Albuquerque, N. Mex. 87111; Gordon E. Pike, 1609 Cedar Ridge, NE., Albuquerque, N. Mex. 87112

[21] Appl. No.: 579,891

[22] Filed: Dec. 28, 1995

Related U.S. Application Data

[63] Continuation of Ser. No. 394,506, Feb. 27, 1995, abandoned.
[51] Int. Cl.$^6$ ............................................. H01G 4/06
[52] U.S. Cl. .................. 361/321.4; 361/321.1; 361/321.5; 361/322
[58] Field of Search .................. 361/320–321.6, 361/311–314, 322; 365/145, 149; 257/295; 501/134–139

[56] References Cited

U.S. PATENT DOCUMENTS

| | | |
|---|---|---|
| 4,636,908 | 1/1987 | Yoshihara et al. ............... 501/136 |
| 4,895,812 | 1/1990 | Wang et al. ....................... 437/180 |
| 5,091,348 | 2/1992 | Woodhead et al. ............... 501/136 |
| 5,164,882 | 11/1992 | Kanai et al. ....................... 501/136 |
| 5,206,788 | 4/1993 | Larson et al. ...................... 361/313 |
| 5,216,572 | 6/1993 | Larson ............................... 361/313 |

Primary Examiner—Bot L. Ledynh
Attorney, Agent, or Firm—Calvin B. Ward

[57] ABSTRACT

An improved ferroelectric capacitor exhibiting reduced imprint effects in comparison to prior art capacitors. A capacitor according to the present invention includes top and bottom electrodes and a ferroelectric layer sandwiched between the top and bottom electrodes, the ferroelectric layer comprising a perovskite structure of the chemical composition $ABO_3$ wherein the B-site comprises first and second elements and a dopant element that has an oxidation state greater than +4. The concentration of the dopant is sufficient to reduce shifts in the coercive voltage of the capacitor with time. In the preferred embodiment of the present invention, the ferroelectric element comprises Pb in the A-site, and the first and second elements are Zr and Ti, respectively. The preferred dopant is chosen from the group consisting of Niobium, Tantalum, and Tungsten. In the preferred embodiment of the present invention, the dopant occupies between 1 and 8% of the B-sites.

1 Claim, 2 Drawing Sheets

FERROELECTRIC CAPACITOR WITH REDUCED IMPRINT

This a continuation of application Ser. No. 08/394,506 filed on Feb. 27, 1995, now abandoned.

This invention was made with Government support under National Center for Advanced Information Component Manufacturing awarded by Advanced Research Projects Agency. The Government has certain rights in this invention.

FIELD OF THE INVENTION

The present invention relates to ferroelectric based capacitors, and more particularly, to an improved ferroelectric capacitor for use in memory systems.

BACKGROUND OF THE INVENTION

Computer memories may be conveniently classified in terms of whether or not the memory retains the information stored therein when power is removed from the memory. Conventional DRAMs and SRAMs are examples of memories that lose their contents when power is removed. EEPROM and flash RAM are examples of non-volatile memories. The cost of non-volatile memories per bit remains sufficiently high to discourage their use in many applications. In addition, the underlying memory structures may only be written a relatively small number of times compared to volatile memories. For example, an EEPROM memory cell can only be written approximately $10^4$ times. In addition, the time required to write data into an EEPROM is much longer than that required to write volatile memories. Hence, EEPROM cells have a relatively limited class of applications.

One class of non-volatile memory that holds the potential for providing increased write cycles and faster writes is based on ferroelectric capacitors. These capacitors have a ferroelectric dielectric which may be polarized in one of two directions. The direction of polarization is used to store information, a "1" corresponding to one direction of polarization and a "0" corresponding to the other direction of polarization. The polarization of the dielectric is maintained when power is removed from the system, thus providing non-volatile operation.

The direction of the polarization may be sensed by applying a potential sufficient to switch the polarization across the capacitor. For the purposes of this discussion, assume that the applied potential difference is such that it would switch the dielectric to the polarization state corresponding to a "1". If the capacitor was polarized such that it stored a "1" prior to the application of the read potential, the polarization will not be altered by the read voltage. However, if the capacitor was polarized such that it stored a "0" prior to the application of the read potential, the polarization direction will switch. This switching will give rise to a current that flows from one plate of the capacitor to the other. A sense amplifier measures the current that flows in response to the read potential to determine the state of the capacitor. Once the capacitor has been read, the data must be rewritten in the capacitor if the read potential caused the state of the capacitor to switch.

A ferroelectric capacitor is normally constructed by depositing a layer of the ferroelectric material on a bottom electrode and then depositing a top electrode on the ferroelectric layer. Ferroelectric layers based on PZT are well known to those skilled in the art. These materials are heated to relatively high temperatures after deposition to provide a perovskite structure having the desired ferroelectric properties. After the annealing process, the dielectric film consists of a large number of domains. Each individual domain has a spontaneous polarization equivalent to that of a monodomain single crystal of the perovskite material. At the end of the deposition process, the remanent polarization of the initial dielectric hysteresis loop is approximately zero; however, the exact state of the initial hysteresis loop does vary depending on the process used in the deposition.

While this type of memory has been known to the art for some time, commercial realizations of this type of memory have been limited because of a phenomenon commonly referred to as "imprint". Imprint is the tendency of a ferroelectric capacitor to exhibit a shift of its hysteresis curve along the voltage axis in either the positive or negative direction depending on the data stored therein. This tendency can lead to a logic state failure for either of two reasons. First, after a sufficient shift, both logic states appear the same to a sense amplifier. Second, the coercive voltage becomes too large to be switched by the programming voltage. When either case is encountered, a memory cell based on the capacitor becomes useless.

Broadly, it is the object of the present invention to provide an improved ferroelectric capacitor for use in memory devices and the like.

It is a further object of the present invention to provide a ferroelectric capacitor that exhibits reduced imprint compared to prior art ferroelectric capacitors.

These and other objects of the present invention will become apparent to those skilled in the art from the following detailed description of the invention and the accompanying drawings.

SUMMARY OF THE INVENTION

The present invention is an improved ferroelectric capacitor exhibiting reduced imprint effects in comparison to prior art capacitors. A capacitor according to the present invention includes top and bottom electrodes and a ferroelectric layer sandwiched between the top and bottom electrodes, the ferroelectric layer comprising a perovskite structure of the chemical composition $ABO_3$ wherein the B-site comprises first and second elements and a dopant element that substitutes for the B-site ion and has an oxidation state greater than +4. The concentration of the dopant is sufficient to reduce shifts in the coercive voltage of the capacitor with time. In the preferred embodiment of the present invention, the ferroelectric element comprises Pb in the A-site, and the first and second elements are Zr and Ti, respectively. The preferred dopant is chosen from the group consisting of Niobium, Tantalum, and Tungsten. In the preferred embodiment of the present invention, the dopant occupies between 1 and 8% of the B-sites.

DETAILED DESCRIPTION OF THE INVENTION

Figure 1:
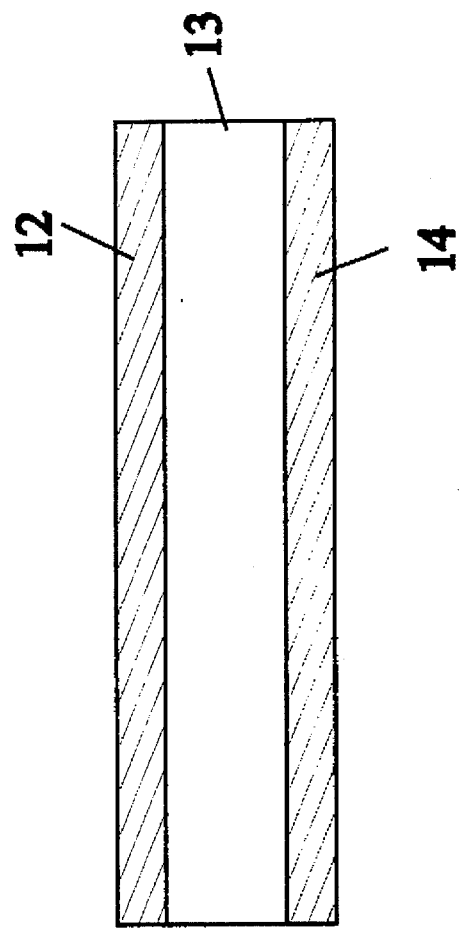
FIG. 1 is a cross-sectional view of a ferroelectric capacitor according to the present invention.

A cross-sectional view of capacitor according to the present invention is shown in FIG. 1 at 10. Capacitor 10 comprises top and bottom electrodes 12 and 14, respectively, which sandwich a layer 13 of ferroelectric material that is deposited so as to form a perovskite structure. The deposition of the ferroelectric material is conventional in the ferroelectric arts, and hence, will not be discussed in more detail here.

Figure 2:
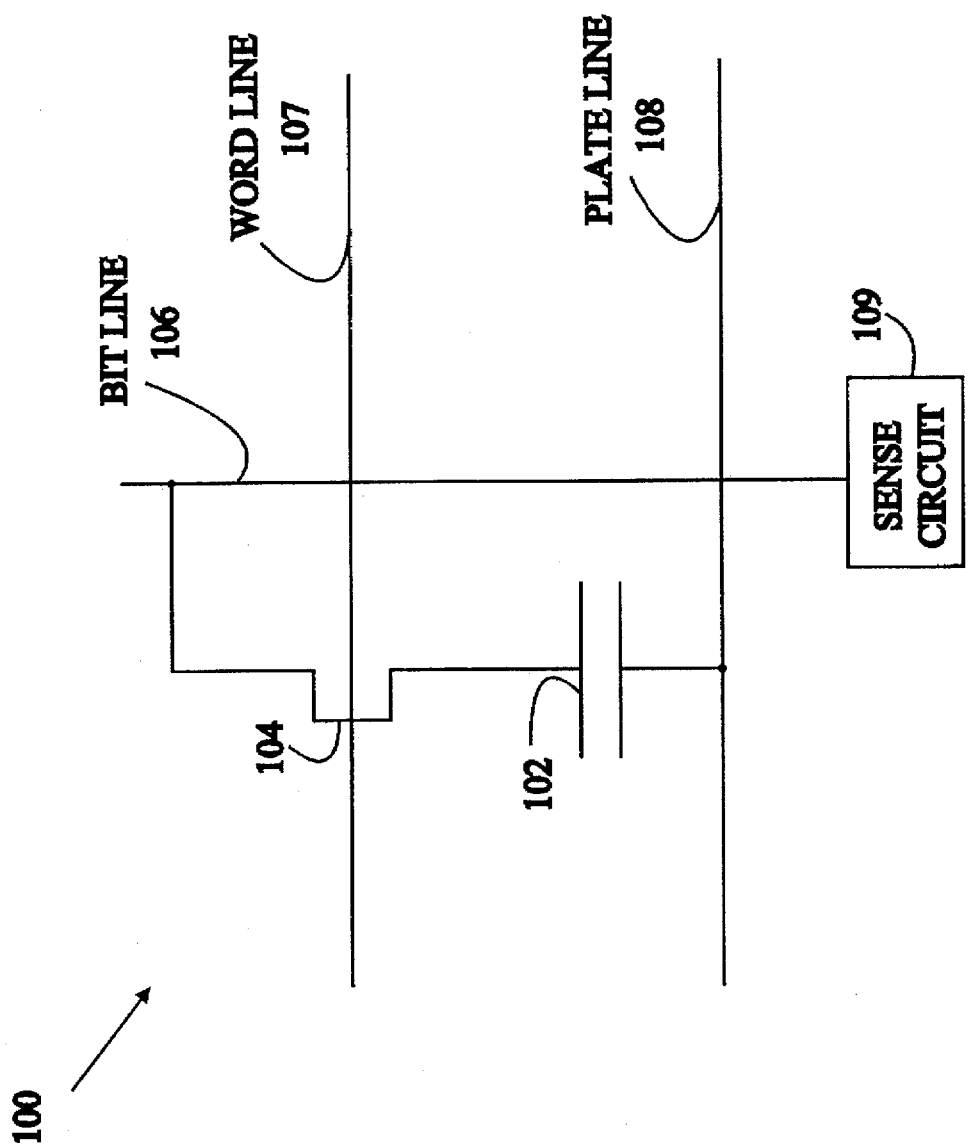
FIG. 2 is a schematic drawing of a memory cell utilizing a ferroelectric capacitor according to the present invention.

A destructively read ferroelectric memory cell consists of a ferroelectric capacitor 102 combined with an n-channel transistor 104 as shown in FIG. 2 at 100. The ferroelectric material of the capacitor has an electrically reversible remanent polarization. When reversed, a large compensating electrical charge must flow between the two plates of the capacitor. Transistor 104 acts as a switch that connects capacitor 102 to the bit line 106 in response to a signal on word line 107. A sensing circuit 109 measures the flow of charge into capacitor 102.

To execute a write, the word line is activated to turn on transistor 104, bit line 106 is set high or low, and then the plate line 108 is pulsed. The direction of polarization of the capacitor is set by the state bit line 106.

To execute a read, transistor 104 is turned on, and plate line 108 is pulsed. The charge on the capacitor is forced onto bit line 106 where it is measured by sense circuit 109. If the capacitor polarization is switched by the read pulse, a current will flow on bit line 106. If, on the other hand, the polarization of capacitor 102 is already oriented in the direction provided by the read pulse, only a small current will flow on bit line 106. In either case, the polarization will be pointing in the direction specified by the read pulse after the read operation, independent of the original direction of polarization of capacitor 102. If the data was destroyed by the read operation, sense circuit 109 re-writes the correct data after the read operation.

The simple perovskite structure is a cubic unit cell. A large cation (A) occupies the corners of the cube, a smaller cation (B) occupies the body center position, and oxygen ions occupy the center of the faces of the unit cell. A generalized chemical formula for this structure is conventionally represented by $ABO_3$. For PZT materials, the A-site is typically occupied by lead, and the B-site is typically occupied by zirconium or titanium. Capacitors with PZT as the dielectric will be referred to as PZT capacitors.

As noted above, conventional PZT capacitors suffer from imprint effects. The degree of imprint may be quantified by measuring the shift in the coercive voltage as a function of time after the capacitor is programmed in one direction of polarization. In general, the coercive voltage shift increases slowly with time. However, it has been found experimentally that the rate of shift can be increased by elevating the temperature of the capacitor. This procedure allows the degree of imprint inherent in any given capacitor design to be estimated without the need to wait for a time period that would be months to years in the absence of the temperature stress. In general, the capacitor to be tested is polarized and then subsequently held at a temperature that is less than the Curie point of the dielectric material. For example, a capacitor having Pt electrodes and a PZT composition of 30/70 exhibits a 2.05 V shift in coercive voltage after being held at 140° C. for 45 minutes in the absence of an externally applied voltage. This represents a 64% shift in the observed coercive voltage which was 3.2 V for the capacitor in question.

The present invention is based on the experimental observation that the inclusion of a dopant element that occupies a portion of the B-sites and has an oxidation state greater than +4 reduces the imprint observed in the capacitors. The voltage shift for a number of B-site dopants have been measured using the temperature accelerated shifting procedure described above. For dopants that have an oxidation state greater than +4, substantial reductions in the shift in coercive voltage are observed. For example, the addition of 4% Nb reduces the percentage shift in coercive voltage to 18% from the 64% value obtained in the absence of the dopant. Similarly, including 4% Ta reduced the shift to less than 10%, and 2% W reduces the shift to 34%. All of these dopants have oxidation states greater than +4.

The optimum level of dopant depends on a number of factors. While the inclusion of the dopant improves imprint, the dopants, in general, decrease the remanent polarization of dielectric. This reduces the amount of charge that is available for detection when the capacitor's state is reversed. Since there is a minimum charge needed to detect the initial state of the capacitor, this effect places an upper limit on the amount of dopant that may be used.

In addition, the addition of these dopants lowers the Curie point of the dielectric material. If the Curie point is too close to the operating temperature of the capacitor, the remanent polarization will be decreased at an unacceptable rate with time, thereby causing retention problems.

In practice, it has been found that the preferred doping concentrations are those that result in 1% to 8% of the B-sites being filled by the dopant. At concentrations below 1%, there is insufficient improvement in imprint. At higher dopant concentrations, the problems discussed above limit the performance of the capacitors. However, it will be apparent to those skilled in the art that other dopant levels may be advantageous in situations in which the operating temperature or other parameters discussed above allow higher dopant levels to be advantageously utilized.

Various modifications to the present invention will become apparent to those skilled in the art from the foregoing description and accompanying drawings. Accordingly, the present invention is to be limited solely by the scope of the following claims.

What is claimed is:

1. An improved ferroelectric capacitor structure comprising:

a top electrode;

a bottom electrode; and a ferroelectric layer sandwiched between said top and bottom electrodes, said ferroelectric layer comprising a perovskite structure of the chemical composition $ABO_3$ wherein said B site comprises first and second elements and a dopant element that has an oxidation state greater than +4 in sufficient concentration to impede shifts in the coercive voltage of said capacitor with time, wherein said ferroelectric element comprises Pb in said A-site, wherein said first and second elements are Zr and Ti, respectively, and wherein said B-site dopant element is chosen from the group consisting of Tantalum and Tungsten.

* * * * *